US012609166B2

(12) United States Patent
Jin

(10) Patent No.: US 12,609,166 B2
(45) Date of Patent: Apr. 21, 2026

(54) MEMORY, OPERATION METHOD OF MEMORY AND MEMORY SYSTEM INCLUDING READ CALIBRATION CIRCUIT

(71) Applicant: YANGTZE MEMORY TECHNOLOGIES CO., LTD., Wuhan (CN)

(72) Inventor: Chong Jin, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 225 days.

(21) Appl. No.: 18/528,376

(22) Filed: Dec. 4, 2023

(65) Prior Publication Data

US 2025/0078933 A1     Mar. 6, 2025

(30) Foreign Application Priority Data

Sep. 5, 2023     (CN) .......................... 202311153979.1

(51) Int. Cl.
*G11C 16/04*      (2006.01)
*G11C 16/24*      (2006.01)
*G11C 16/26*      (2006.01)

(52) U.S. Cl.
CPC .......... *G11C 16/24* (2013.01); *G11C 16/0483* (2013.01); *G11C 16/26* (2013.01)

(58) Field of Classification Search
CPC ..... G11C 16/24; G11C 16/0483; G11C 16/26; G11C 11/5642; G11C 5/147; G11C 7/1057; G11C 7/106; G11C 7/1069; G11C 7/24; G11C 29/44

USPC ...................................................... 365/185.18
See application file for complete search history.

(56) References Cited

U.S. PATENT DOCUMENTS

| | | | |
|---|---|---|---|
| 7,016,230 B2 * | 3/2006 | Hosono ................... | G11C 16/26 |
| | | | 365/185.21 |
| 10,283,201 B2 * | 5/2019 | Inoue ...................... | G11C 16/26 |
| 2024/0153565 A1 * | 5/2024 | Cho ........................ | G11C 16/26 |

FOREIGN PATENT DOCUMENTS

| | | |
|---|---|---|
| CN | 101154448 A | 4/2008 |
| CN | 109801651 A | 5/2019 |
| CN | 113823337 A | 12/2021 |
| CN | 115206387 A | 10/2022 |
| KR | 20220140273 A | 10/2022 |

OTHER PUBLICATIONS

Yangtze Memory Technologies Co., Ltd., "First Examination Opinion Notice," Date of Publication: Aug. 28, 2025, Chinese Patent App. No. 202311153979.1, 7 p. (translation 7 p.).

* cited by examiner

*Primary Examiner* — Tha-O H Bui
(74) *Attorney, Agent, or Firm* — Conley Rose, P.C.

(57)     ABSTRACT
A memory includes a page buffer that includes a sensing latch circuit, a first charge circuit and a read calibration circuit. The first charge circuit and the sensing latch circuit are coupled to a sensing node, and the read calibration circuit is coupled to the sensing latch circuit at a first end and to the sensing node at a second end, and is configured to calibrate a potential of the sensing node during sensing. The above-mentioned memory is applied in a calibration process of the potential of the sensing node during sensing.

18 Claims, 12 Drawing Sheets

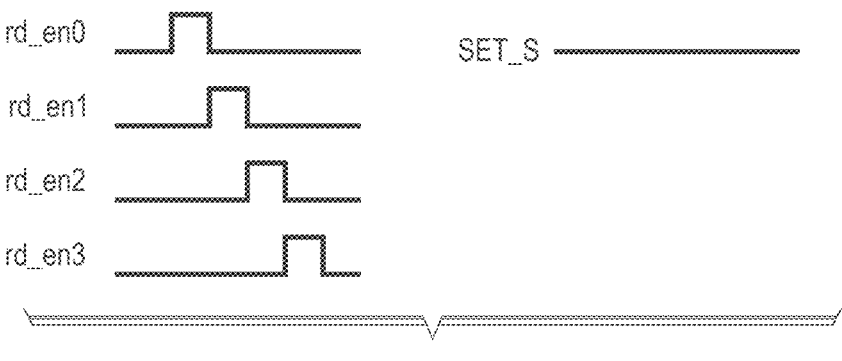

FIG. 15

```
A PAGE BUFFER DISCHARGES A SENSING
NODE FROM A FIRST VOLTAGE VALUE TO
A SECOND VOLTAGE VALUE IN A FIRST
SUB-STAGE OF A CALIBRATION STAGE          S1601

THE PAGE BUFFER CHARGES THE SENSING
NODE FROM THE SECOND VOLTAGE VALUE
TO A THIRD VOLTAGE VALUE IN A SECOND
SUB-STAGE OF THE CALIBRATION STAGE         S1602

THE PAGE BUFFER STORES A STATE
OF A MEMORY CELL COUPLED WITH
A BIT LINE IN A SENSING STAGE              S1603
```

FIG. 16

MEMORY, OPERATION METHOD OF MEMORY AND MEMORY SYSTEM INCLUDING READ CALIBRATION CIRCUIT

CROSS-REFERENCE TO RELATED APPLICATIONS

The present application claims priority to Chinese Patent Application No. 2023111539791, which was filed Sep. 5, 2023, is titled "MEMORY, MEMORY OPERATING METHOD AND MEMORY SYSTEM," and is hereby incorporated herein by reference in its entirety.

TECHNICAL FIELD

The present disclosure relates to the technical field of memories, and particularly to a memory, an operation method of the memory, and a memory system.

BACKGROUND

A non-volatile memory is a memory capable of storing data for a long time without being powered on. A flash device has developed into a universal type of non-volatile memory applied widely. The flash device is usually used in an electronic system, such as a personal computer, a digital camera, a digital media player, a digital recorder, a vehicle, a wireless apparatus, a cell phone and a mobile memory module, and the usage of the flash memory is increasingly expanding.

The flash device comprises memory cells. To sense content stored in a memory cell is also one operation of the flash device, and a circuit to achieve this purpose is called a page buffer (PB). The page buffer determines the content in the memory cell by comparing a voltage level of the sensing node after discharging with a predetermined voltage level. Thus, if a voltage drop of the page buffer has a voltage offset, it will lead to output of a wrong sensing result.

SUMMARY

Examples of the present disclosure provide a memory, an operation method of the memory, and a memory system, in order to improve the reliability of a page buffer.

In a first aspect, a memory is provided, which comprises a page buffer that comprises a sensing latch circuit, a first charge circuit and a read calibration circuit. The first charge circuit is coupled to a sensing node, and the read calibration circuit is coupled to the sensing latch circuit at a first end and to the sensing node at a second end, and is configured to calibrate a potential of the sensing node during sensing.

The read calibration circuit is newly added in a page buffer of the memory provided by the above examples of the present disclosure. The read calibration circuit may calibrate a potential of the sensing node during sensing. Thus, a voltage offset in the page buffer caused by a device process can be eliminated, and the reliability of a sensing result of the page buffer can be improved.

In some examples, the read calibration circuit comprises a first sub-circuit and a second sub-circuit, wherein the first sub-circuit is configured to discharge the sensing node from a first voltage value to a second voltage value in a first sub-stage of a calibration stage, and the second sub-circuit is configured to charge the sensing node from the second voltage value to a third voltage value in a second sub-stage of the calibration stage.

In these examples, the reliability of the sensing result of the page buffer can be improved, by discharging a voltage value of the sensing node from the first voltage value to the second voltage value and charging it from the second voltage value to the third voltage value that is a voltage value after the voltage offset of the sensing node is eliminated.

In some examples, the first sub-circuit comprises a first transistor, a second transistor and a third transistor. A first end of the first transistor is coupled to the first end of the read calibration circuit; a second end of the first transistor is coupled to a first end of the third transistor; a first end of the second transistor is coupled to the first end of the first transistor; a second end of the second transistor and a second end of the third transistor are coupled and coupled to the second end of the read calibration circuit; and a control end of the third transistor is coupled to ground.

In some examples, the first transistor and the second transistor are turned on, and the third transistor is cut off in the first sub-stage of the calibration stage. The first transistor and the third transistor are cut off, and the second transistor is turned on in the second sub-stage of the calibration stage.

In these examples, in the first sub-stage of the calibration stage, the first transistor and the second transistor are controlled to be turned on, and the third transistor is controlled to be cut off. That is, the sensing node can be discharged through the third transistor. At this time, due to different threshold voltages of different third transistors, the second voltage values after discharging are different as well, which means that different information of the threshold voltages is recorded by the second voltage values. In the second sub-stage of the calibration stage, the first transistor and the third transistor are controlled to be cut off, and the second transistor is controlled to be turned on. Thus, the sensing node can be charged through the second sub-circuit to ensure an enough initial voltage value in a subsequent sensing stage. As such, in the whole calibration stage, different threshold voltages are calibrated, which can eliminate the voltage offset in the page buffer and improve the reliability of the sensing result of the page buffer.

In some examples, the sensing process further comprises a sensing stage in which the first transistor is turned on and the second transistor is cut off.

In these examples, in the calibration stage before the sensing stage, different second voltage values may be obtained for different threshold voltages of the third transistor, and then the different second voltage values are coupled and raised to obtain different third voltage values. That is, the initial voltages of the sensing stage are different, thereby reducing the influence of the different threshold voltages of the transistors on the voltage offset.

In some examples, the second sub-circuit comprises a capacitance and a second charge circuit, wherein a first end of the capacitance is coupled to the sensing node; a second end of the capacitance is coupled a first node; the first node is further coupled to an output end of the second charge circuit; the second charge circuit is configured to charge the first node in the second sub-stage of the calibration stage; and the sensing node is charged from the second voltage value to the third voltage value.

In these examples, the capacitance has the characteristic that a capacitance capacity and a capacitance potential difference do not have an abrupt change, and the first node can be charged through the second charge circuit to couple and raise the voltage of the sensing node, so as to ensure an enough initial voltage value in the subsequent sensing stage.

In some examples, the capacitance is a stray capacitance.

In some examples, the sensing latch circuit comprises: a first phase inverter and a second phase inverter, a fourth transistor, a fifth transistor and a sixth transistor. A first end of the first phase inverter is coupled to a first end of the second phase inverter; a second end of the first phase inverter is coupled to a second end of the second phase inverter; a first end of the fourth transistor is coupled to the first end of the first phase inverter; a second end of the fourth transistor is coupled to a first end of the sixth transistor; a second end of the sixth transistor is coupled to ground; a first end of the fifth transistor is coupled to the second end of the second phase inverter; and a second end of the fifth transistor is coupled to the first end of the sensing latch circuit.

In some examples, the page buffer further comprises an input circuit, wherein a first end of the input circuit is coupled to a bit line, and a second end of the input circuit is coupled to the sensing node.

In a second aspect, an operation method of a memory is provided, which comprises: discharging a sensing node from a first voltage value to a second voltage value in a first sub-stage of a calibration stage; charging the sensing node from the second voltage value to a third voltage value in a second sub-stage of the calibration stage; and storing a state of a memory cell coupled with a bit line in a sensing stage.

The beneficial effects of the second aspect may refer to the description of the first aspect.

In some examples, charging the sensing node from the second voltage value to the third voltage value in the second sub-stage of the calibration stage comprises: applying a first voltage to a control end of a second transistor of a read calibration circuit in the second sub-stage of the calibration stage.

In some examples, charging the sensing node from the second voltage value to the third voltage value in the second sub-stage of the calibration stage comprises: charging a first node in the second sub-stage of the calibration stage.

In some examples, the method further comprises: charging the sensing node to the first voltage value before the first sub-stage of the calibration stage.

In some examples, the method further comprises: obtaining the state of the memory cell coupled with the bit line in the sensing stage.

The beneficial effects of the second aspect may refer to the description of the first aspect.

In a third aspect, a memory system is provided, which comprises: one or more memories of the first aspect, and a memory controller coupled to the memories and configured to control the memories.

In a fourth aspect, an electronic apparatus is provided, which comprises the memory system above.

BRIEF DESCRIPTION OF THE DRAWINGS

To illustrate the technical solution in the present disclosure more clearly, the drawings to be used in some examples of the present disclosure will be briefly introduced below. The drawings in the following description are only drawings of some examples of the present disclosure. Those of ordinary skills in the art may also obtain other drawings according to these drawings. In addition, the drawings in the following description may be regarded as schematic diagrams, instead of limiting an actual size of a product, an actual flow of a method, an actual timing of a signal, etc. involved in the examples of the present disclosure.

FIG. 15 is a timing diagram of control signals of first transistors in a plurality of page buffers provided by examples of the present disclosure.

FIG. 16 is a flow diagram of an operation method of a memory provided by examples of the present disclosure.

DETAILED DESCRIPTION

Figure 1:
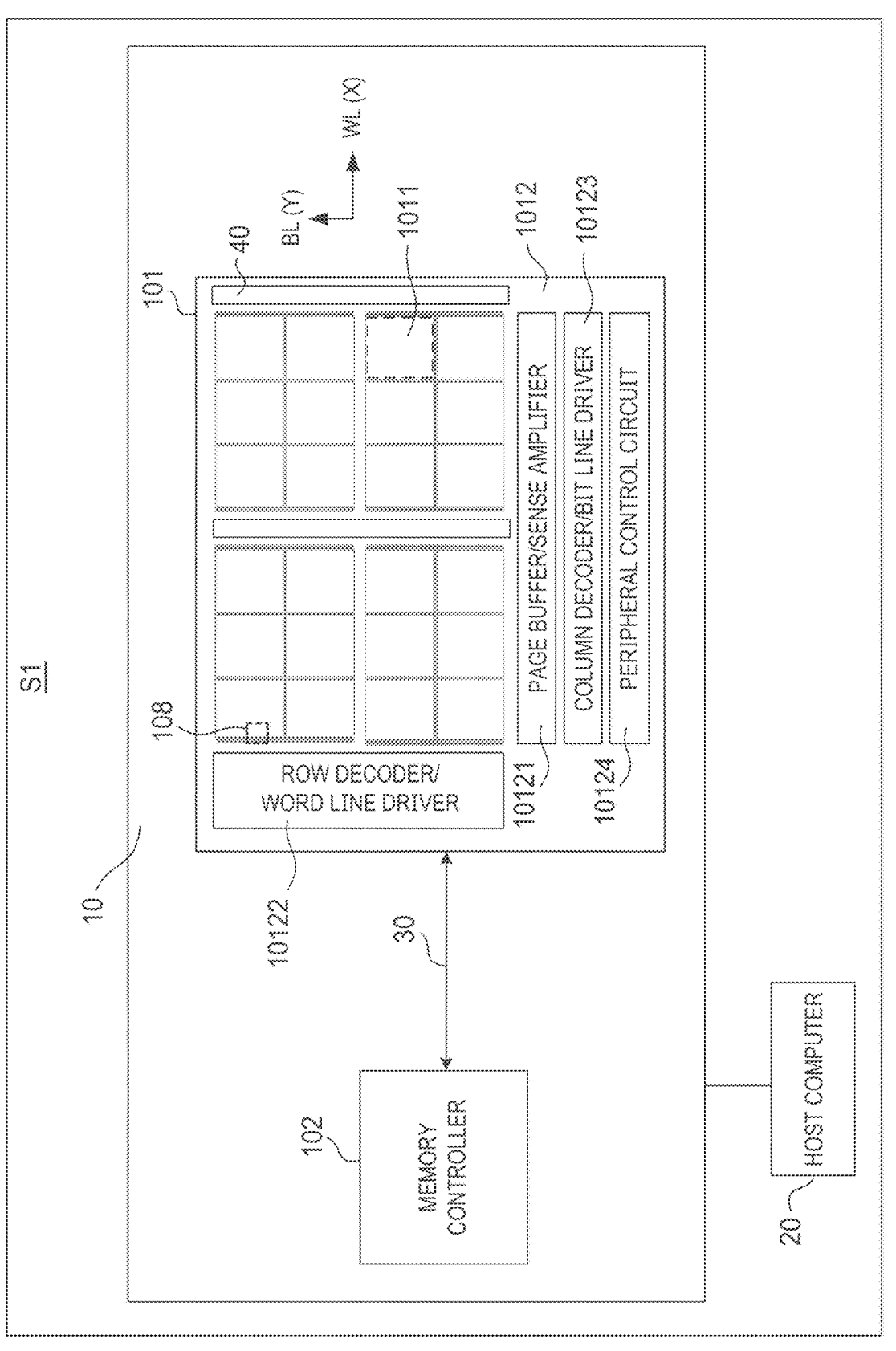
FIG. 1 is a schematic structural diagram of an example system S1 having a memory system 10 provided by examples of the present disclosure.

The technical solutions in some examples of the present disclosure will be described below clearly and completely in conjunction with the drawings. The examples described are only part of, but not all of, the examples of the present disclosure. All other examples obtained by those of ordinary skills in the art based on the examples provided by the present disclosure shall fall in the scope of protection of the present disclosure.

In the description of the present disclosure, the terms "center", "upper", "lower", "front", "rear", "left", "right", "vertical", "horizontal", "top", "bottom", "inner", "outer", etc. indicate orientations or position relationships that are based on the orientations or position relationships as shown in the drawings, and are only intended to facilitate description of the present disclosure and to simplify the description, instead of indicating or implying that a device or an element indicated must have a specific orientation or be constructed and operated in a specific orientation, and thus cannot be understood as limiting the present disclosure.

Unless otherwise specified in the context, throughout the specification and the claims, the term "comprise" is interpreted as an open and inclusive meaning, i.e., "including, but not limited to". In the description of the specification, the terms "one example", "some examples", "an example", "in an example", or "some examples" indicate that particular features, structures, materials, or characteristics related to the example or implementation are included in at least one example or implementation of the present disclosure. The schematic representation of the above terms may not necessarily refer to the same example or implementation. Furthermore, said particular features, structures, materials, or characteristics may be included in one or more examples or implementations in any suitable manner.

In the following, the terms "first" and "second" are only for the purpose of description, and cannot be construed as indicating or implying relative importance or implicitly indicating the number of indicated technical features. Thus, features defined by "first" and "second" may explicitly or implicitly include one or more of such features. In the description of the examples of the present disclosure, "a plurality of" means two or more, unless otherwise stated. "At least one of A, B and C" and "at least one of A, B or C" have the same meaning, both including the following combinations of A, B and C: A alone, B along, C alone, a combination of A and B, a combination of A and C, a combination of B and C, and a combination of A, B and C. "A and/or B" includes the following three combinations: A alone, B alone, and a combination of A and B.

The use of "suitable for" or "configured to" herein means open and inclusive language, and does not exclude an apparatus suitable for performing or configured to perform additional tasks or steps.

In addition, the use of "based on" means openness and inclusiveness, as processes, steps, calculations, or other actions "based on" one or more conditions or values may be based on an additional condition or exceeded the values in practice.

As used herein, the term "substrate" refers to a material onto which subsequent material layers may be added. The substrate itself can be patterned. Materials added onto the substrate can be patterned or can remain unpatterned. Furthermore, the substrate may include a variety of semiconductor materials, such as silicon, germanium, gallium arsenide, indium phosphide, etc. Alternatively, the substrate can be made from an electrically non-conductive material, such as a glass, a plastic, or a sapphire wafer, etc.

The term "three-dimensional memory" refers to a semiconductor device formed by memory cell transistor strings (referred to herein as "memory cell strings," such as NAND memory cell strings) that are arranged in an array on a main surface of a substrate or a source layer and extend along a direction perpendicular to the substrate or the source layer. As used herein, the term "vertical/vertically" means nominally perpendicular to the main surface (i.e., a lateral surface) of the substrate or the source layer.

For case of understanding, a memory system provided by examples of the present disclosure is first introduced below.

As shown in FIG. 1, FIG. 1 is a schematic structural diagram of an example system S1 having a memory system 10 provided by examples of the present disclosure. The system S1 may be a mobile phone, a desktop computer, a laptop computer, a tablet computer, a vehicle computer, a gaming console, a printer, a positioning apparatus, a wearable electronic apparatus, a smart sensor, a Virtual Reality (VR) apparatus, an Augmented Reality (AR) apparatus, or any other suitable electronic apparatuses having memory devices therein. The memory system 10 comprises a memory 101 and a memory controller 102. The memory system 10 may communicate with a host computer 20 through the memory controller 102, wherein the memory controller 102 may be coupled to the memory 101 via a memory channel 30. In some examples, the memory 101 in the present disclosure may be a three-dimensional non-volatile memory, which may be for example, a NAND flash that may be abbreviated as a flash or NAND. When the memory 101 is the NAND, the memory system 10 may be called a NAND memory system. The memory 101 in the present disclosure may be also other memories. The memory system 10 may have more than one memory 101, and each memory 101 may be managed by the memory controller 102.

In some examples, the host computer 20 may be a processor of an electronic apparatus, for example, a central processing unit (CPU), a system-on-chip (SoC) or an application processor (AP). The host computer 20 may send data to be stored at the memory system 10, or read data stored in the memory system 10.

The memory controller 102 may process an input/output (I/O) request received from the host computer 20 to guarantee data integrity and effective storage, and may also manage the memory 101. The memory channel 30 may provide data via a data bus and control communications between the memory controller 102 and the memory 101.

With continued reference to FIG. 1, the memory 101 may be a memory chip (package), a memory die or any part of the memory die, and may comprise a plurality of blocks 1011. The block 1011 may be of megabyte (MB) size, and is a minimum unit of carrying out an erase operation. Each block 1011 may comprise a plurality of memory cells, each of which is addressed through, for example, bit lines (BLs) and word lines (WLs). The bit lines and the word lines may be arranged vertically (for example, in a row and a column respectively), so as to form an array of metal lines. The directions of the bit line and the word line are labeled as "BL" and "WL" in FIG. 1, respectively. In the present disclosure, one or more blocks 1011 may be also called a "memory array" or an "array". The memory array is a core region in a memory apparatus, and performs a storage function.

The memory 101 further comprises a peripheral circuit region 1012. The peripheral circuit region 1012 (also referred to as a peripheral circuit) contains many digital, analog and/or hybrid-signal circuits (for example, a page buffer/sense amplifier 10121, a row decoder/word line driver 10122, a column decoder/bit line driver 10123 and a peripheral control circuit 10124) to support functions of the memory 101. The peripheral control circuit 10124 may comprise a register, an active and/or passive semiconductor apparatus, for example, a transistor, a diode, a capacitor, or a resistor or the like, which is apparent to those of ordinary skill in the art. The peripheral control circuit 10124 of the peripheral circuit region 1012 may be configured to initiate a program operation for selected memory cells of the NAND memory string in the block 1011. In some implementations, the peripheral control circuit 10124 receives a program command from the memory controller 102 through an interface, and as a response, sends a control signal to the row decoder/word line driver 10122, the column decoder/bit line driver 10123 and a voltage generator (not shown in FIG. 1) arranged in the peripheral circuit region 1012, so as to initiate the program operation for the selected memory cell.

A layout of electronic devices in the memory system 10 and the memory 101 in FIG. 1 is shown as an example. The memory system 10 and the memory 101 may have other layouts, and may comprise additional devices. For example, the memory 101 may further comprise a high voltage charge pump, and an input/output circuit, etc. The memory system 10 may further comprise a firmware and a data scrambler, etc. In some examples, the peripheral circuit region 1012 and the memory array may be formed in separate wafers independently, and connected with each other via wafer bonding.

Figure 3:
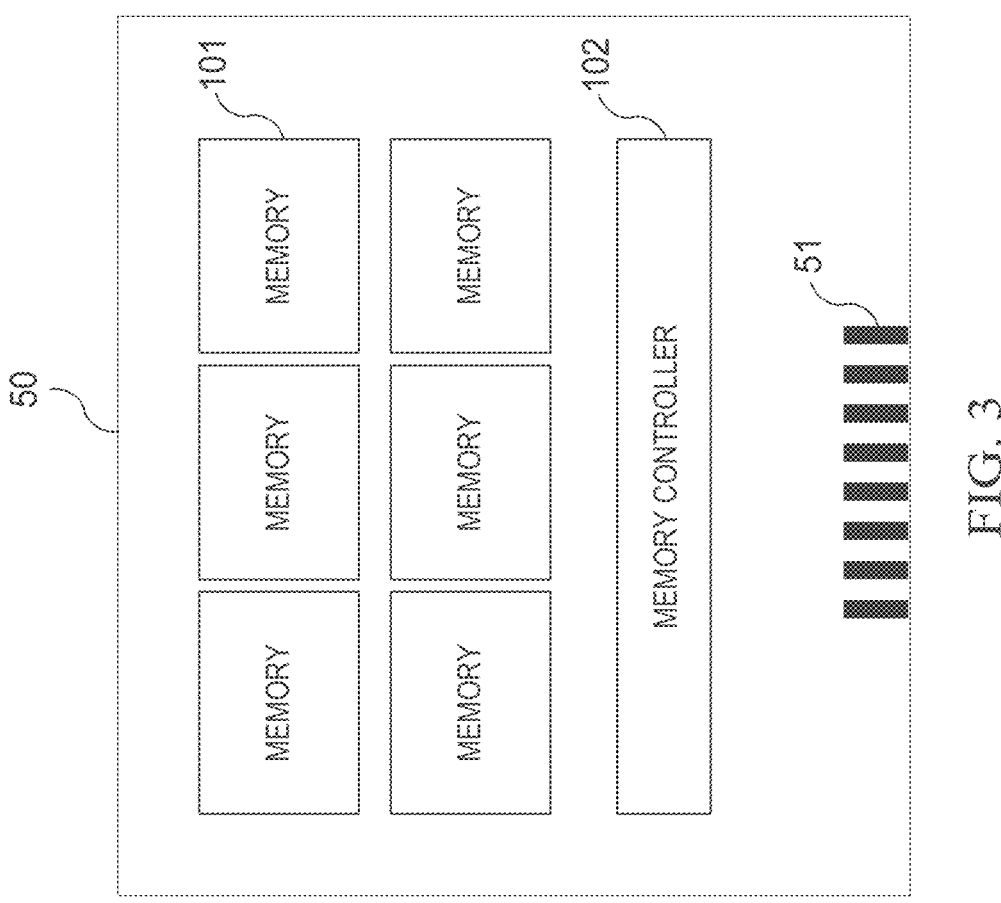
FIG. 3 is a schematic diagram of another memory card provided by examples of the present disclosure.
Figure 2:
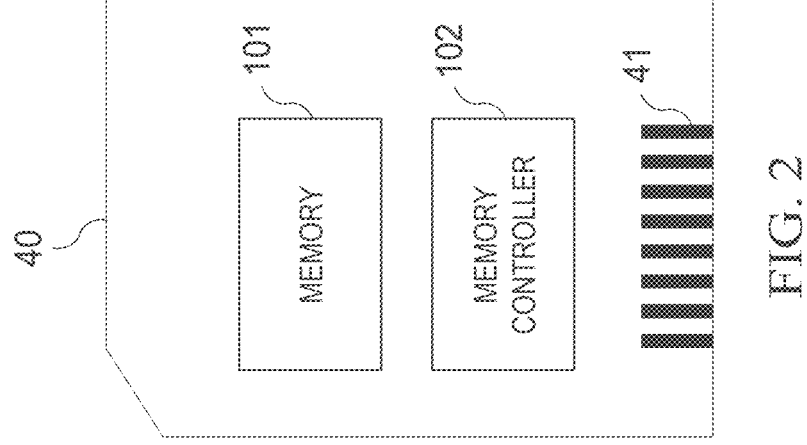
FIG. 2 is a schematic diagram of a memory card provided by examples of the present disclosure.

The memory controller 102 and one or more memories 101 may be integrated in various types of memory apparatuses, for example, be included in the same package, e.g., a Universal Flash Storage (UFS) package or an Embedded Multi Media Card (eMMC) package. The memory system 10 may be implemented and packaged into different types of end electronic products. In one example, as shown in FIG. 2, the memory controller 102 and a single memory 101 may be integrated into a memory card 40. The memory card 40 may include a Personal Computer Memory Card International Association (PCMCIA) card, a Compact Flash (CF) card, a Smart Media (SM) card, a memory stick, a Multimedia card (MMC), a Secure Digital (SD) memory card, or a UFS, etc. The memory card 40 may further comprise a memory card connector 41 coupling the memory card 40 with the host computer 20. In another example, as shown in FIG. 3, the memory controller 102, and multiple memories 101 may be integrated into a Solid State Drive (SSD) 50. The SSD 50 may further comprise an SSD connector 51 coupling the SSD 50 with the host computer 20.

Figure 4:
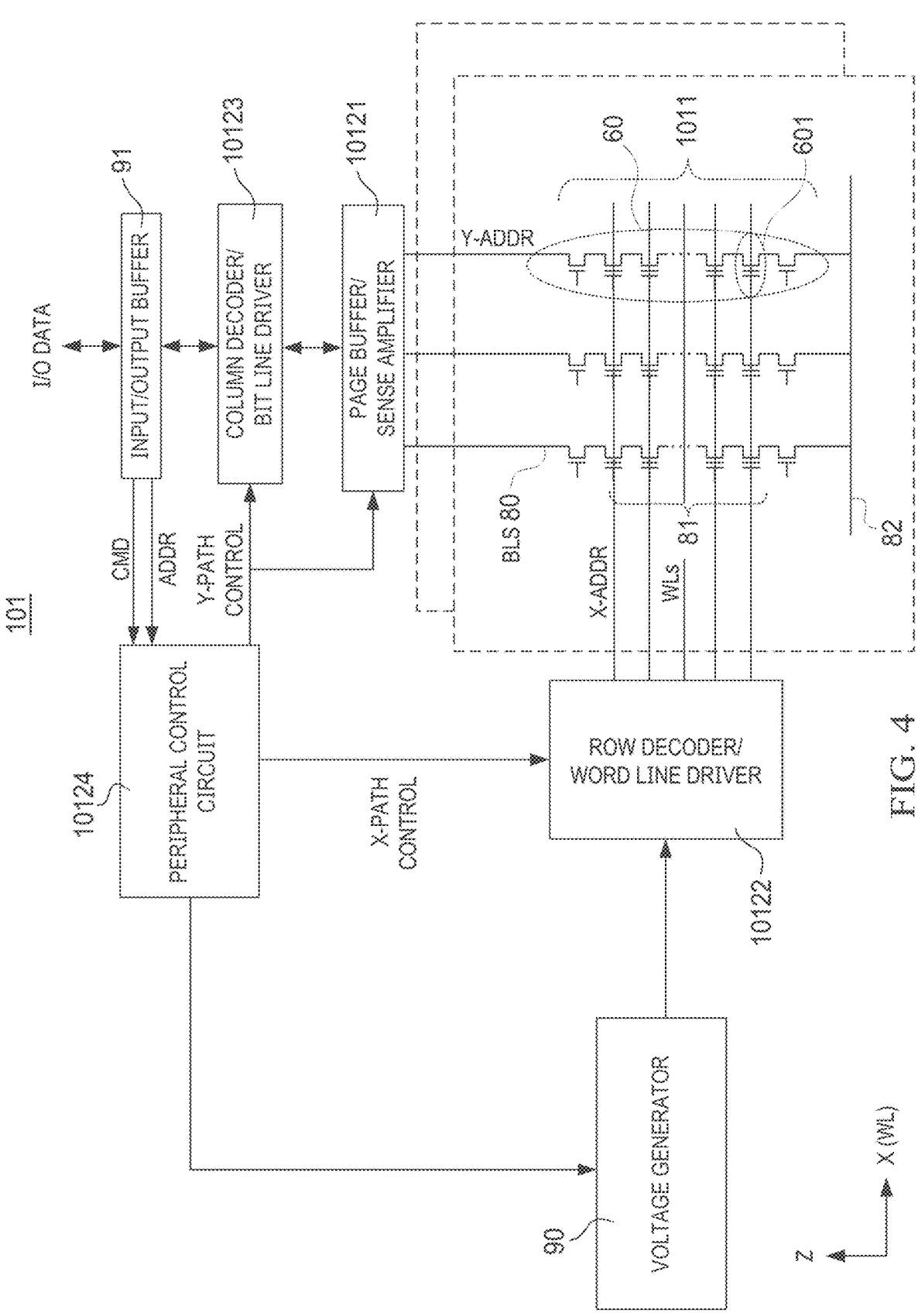
FIG. 4 is a schematic structural diagram of a memory 101 provided by examples of the present disclosure.

As shown in FIG. 4, FIG. 4 is a schematic structural diagram of a memory 101 provided by examples of the present disclosure. The memory 101 comprises one or more blocks 1011. Each block 1011 comprises memory strings 60. Each memory string 60 comprises memory cells 601. The memory cells 601 sharing the same bit line form the memory string 60. The memory string 60 further comprises at least one field effect transistor (for example, a metal-oxide-semiconductor field-effect transistor (MOSFET)) at each end, and the field effect transistor may be controlled by a top select transistor and a bottom select transistor, respectively. A drain terminal of the top select transistor may be coupled to a bit line 80, and a source terminal of the bottom select transistor may be coupled to an array common source (ACS) 82. The ACS 82 may be shared by the memory strings 60 in the whole block 1011, and is also referred to as a common source line (SL).

In some examples, the peripheral circuit region 1012 of the memory 101 can support an erase operation of a GIDL assistance technology. The block 1011 may be coupled with the row decoder/word line driver 10122 via a word line 81, the top select transistor and the bottom select transistor. The block 1011 may be coupled with the page buffer/sense amplifier 10121 via the bit line 80. The row decoder/word line driver 10122 may select one of the blocks 1011 on the memory 101 in response to an X-path control signal provided by the peripheral control circuit 10124. The row decoder/word line driver 10122 can transfer voltages provided from a voltage generator 90 to the word line 81 according to the X-path control signal. During read and program operations, the row decoder/word line driver 10122 may transfer a read voltage (Vread) and a program voltage (Vpgm) to the selected word line 81 according to the X-path control signal received from the peripheral control circuit 10124, and transfer a pass voltage Vpass to non-selected word lines.

The column decoder/bit line driver 10123 may transfer an inhibition voltage (Vinhibit) to non-selected bit lines according to a Y-path control signal received from the peripheral control circuit 10124, and couple a selected bit line 80 to ground. The column decoder/bit line driver 10123 may be configured to select or deselect one or more memory strings 60 according to the Y-path control signal from peripheral control circuit 10124. Page buffer/sense amplifier 10121 may be configured to read and program (write) data to and from the block 1011 according to the Y-path control signal from peripheral control circuit 10124. For example, the page buffer/sense amplifier 10121 may store a page of data to be programmed to one memory page. In another example, the page buffer/sense amplifier 10121 may perform a verify operation to ensure that the data has been properly programmed to each memory cell 601. In yet another example, during the read operation, the page buffer/sense amplifier 10121 may sense current flowing through the bit line 80 that reflects a logic state (e.g., data) of the memory cell 601, and an amplification ratio amplifying a small signal to a measurable signal.

An input/output buffer 91 may transfer I/O data to/from the page buffer/sense amplifier 10121, and transfer an address (ADDR) signal or a command (CMD) signal to the peripheral control circuit 10124. In some examples, the input/output buffer 91 may be used as an interface between the memory controller 102 and the memory 101.

The peripheral control circuit 10124 may control the page buffer/sense amplifier 10121 and the row decoder/word line driver 10122 in response to a command transferred by the input/output buffer 91. During the program operation, the peripheral control circuit 10124 may control the row decoder/word line driver 10122 and the page buffer/sense amplifier 10121 to program the selected memory cell 601. During the read operation, the peripheral control circuit 10124 may control the row decoder/word line driver 10122 and the page buffer/sense amplifier 10121 to read the selected memory cell 601. The X-path control signal comprises a row address X-ADDR, and the Y-path control signal comprises a column address Y-ADDR, both of which may be used to locate the selected memory cell 601 in the block 1011. The row address X-ADDR may comprise a page index, a block index and a plane index to identify a memory page and the block 1011 respectively. The column address Y-ADDR may identify bytes or words in the data of the memory page.

In some implementations, the peripheral control circuit 10124 may comprise one or more control logic units. Each control logic unit as described herein may be at least one of a software module or a firmware module running on a processor, for example, a micro controller unit (MCU) as part of the peripheral control circuit 10124, or a hardware module of a finite-state machine (FSM), for example, an integrated circuit (IC), such as an application-specific IC (ASIC), and a field-programmable gate array (FPGA), etc., or a combination of the software module, the firmware module and the hardware module.

The voltage generator 90 may generate a voltage provided to the word line 81 and the bit line 80 under the control of the peripheral control circuit 10124. The voltage generated by the voltage generator 90 includes a read voltage (Vread), a program voltage (Vpgm), a pass voltage (Vpass), and an inhibition voltage (Vinhibit), etc.

In some examples, the memory 101 may be formed based on a floating gate technology. In some examples, the memory 101 may be formed based on a charge trapping technology. The memory 101 based on charge trapping can provide high storage density and high intrinsic reliability. Storage data or logic states (e.g., a threshold voltage (Vth) of the memory cell 601) depend on the amount of charge trapped in a storage layer. In some examples, the memory 101 may be a three-dimensional (3D) memory apparatus, wherein the memory cells 601 may be vertically stacked on top of each other.

In some examples, when the erase operation is performed, by applying a negative voltage difference between gate and source terminals (e.g., the ACS 82) of the memory cell 601, all electronic charge trapped in the storage layer of the memory cell 601 can be removed, and all the memory cells 601 in the same block 1011 may be reset to an erased state (ER) as a logic "1". For example, a control gate in the memory cell 601 may be coupled to ground, and a positive voltage may be applied to the source line 82 to trigger a voltage difference. In this example, a voltage pulse may be applied to the memory cell 601 in the erase operation.

Figure 5:
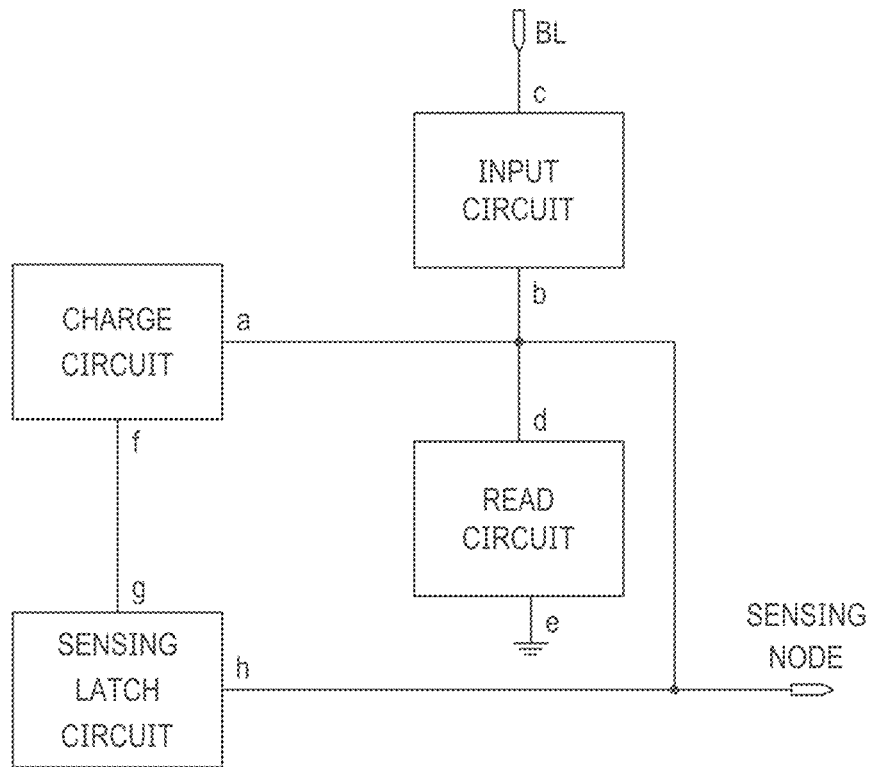
FIG. 5 is a schematic structural diagram of a page buffer 10121 provided by examples of the present disclosure.

In an example, as shown in FIG. 5, FIG. 5 is a schematic structural diagram of a page buffer 10121 provided by examples of the present disclosure. The page buffer 10121 may comprise a charge circuit, a sensing latch circuit, a read circuit and an input circuit. A first end (e.g., a connecting end a in FIG. 5) of the charge circuit is coupled to a first end (e.g., a connecting end b in FIG. 5) of the input circuit. The first end of the charge circuit is further coupled to a sensing node (SO). A second end (e.g., a connecting end c in FIG. 5) of the input circuit is coupled to the bit line BL. A first end of the input circuit is coupled to a first end (e.g., a connecting end d in FIG. 5) of the read circuit. A second end (e.g., a connecting end e in FIG. 5) of the read circuit is coupled to ground. A second end (e.g., a connecting end f in FIG. 5) of the charge circuit is coupled to a first end (e.g., a connecting end g in FIG. 5) of the sensing latch circuit. A second end (e.g., a connecting end h in FIG. 5) of the sensing latch circuit is coupled to the sensing node.

The charge circuit is configured to charge the sensing node. The input circuit is configured to obtain a state of the memory cell connected with the bit line. The sensing latch circuit is configured to store the state of the memory cell coupled with the bit line. The read circuit is configured to read the state of the memory cell coupled with the bit line that is stored by the sensing latch circuit.

Figure 6:
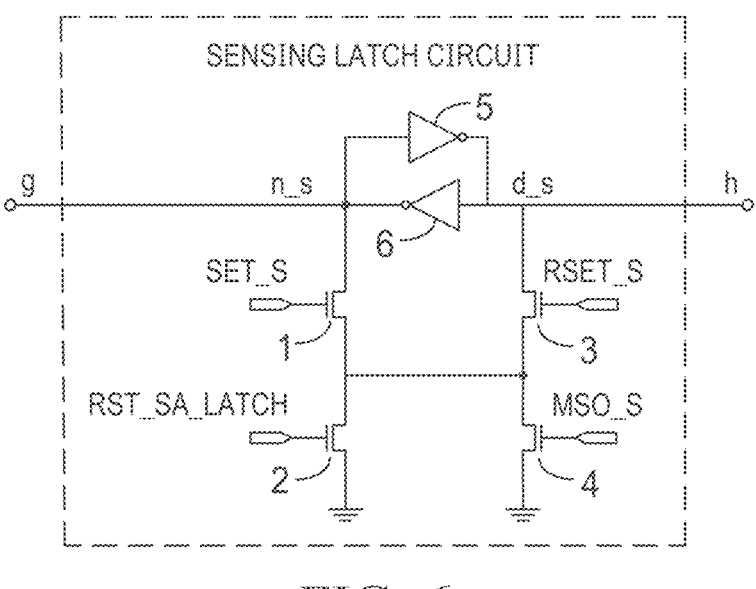
FIG. 6 is a schematic structural diagram of a sensing latch circuit provided by examples of the present disclosure.

In an example, a schematic structural diagram of the sensing latch circuit is as shown in FIG. 6. The sensing latch circuit comprises a transistor 1, a transistor 2, a transistor 3, a transistor 4, a phase inverter 5 and a phase inverter 6. An input end of the phase inverter 5 is coupled to an output end of the phase inverter 6, and an output end of the phase inverter 5 is coupled to an input end of the phase inverter 6. In addition, a coupling point of the input end of the phase inverter 5 and the output end of the phase inverter 6 is a first latch node (n_s), and a coupling point of the output end of the phase inverter 5 and the input end of the phase inverter 6 is a second latch node (d_s). The first latch node is coupled to the first end g of the sensing latch circuit, and the second latch node is coupled to the second end h of the sensing latch circuit. A first end of the transistor 1 is coupled to the first latch node, a second end of the transistor 1 is coupled to a first end of the transistor 2, and a control end of the transistor 1 is configured to receive a set signal (SET_S). A second end of the transistor 2 is coupled to ground, a control end of the transistor 2 is configured to receive a reset signal (RST-_SA_LATCH), and the first end of the transistor 2 is further coupled to a second end of the transistor 3. A first end of the transistor 3 is coupled to the second latch node, and a control end of the transistor 3 is configured to receive a reset signal (RSET_S). A first end of the transistor 4 is coupled to the second end of the transistor 3, a second end of the transistor 4 is coupled to ground, and a control end of the transistor 4 is configured to receive a sensing signal (MSO_S).

In addition to the sensing latch circuit, there are transistors in the input circuit, the charge circuit and the read circuit as well. Due to process difference, a threshold voltage of each transistor is different, such that a voltage offset may be caused, and different trip voltages during a sensing process may be caused, which may, in turn, influence an edge summation (ESUM) loss.

Figure 7:
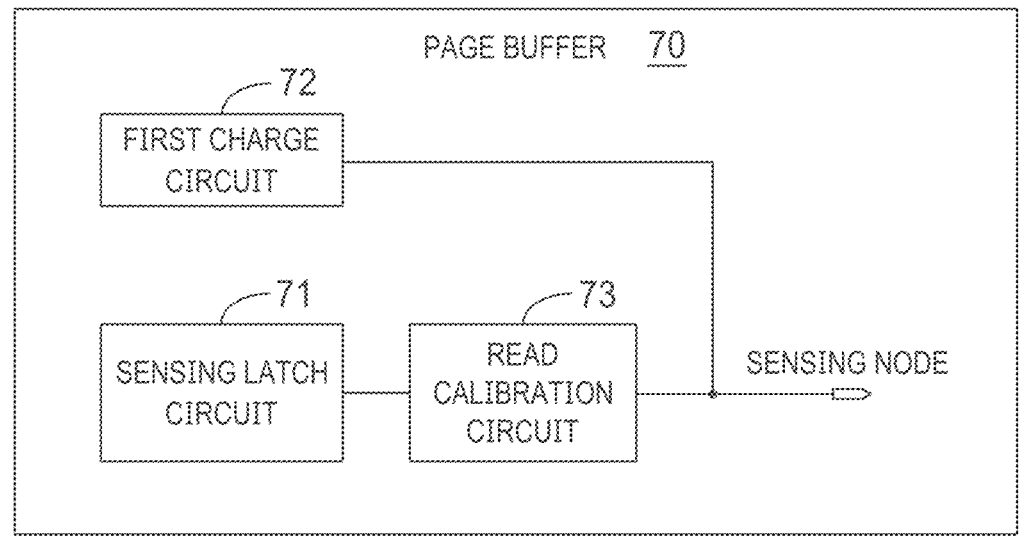
FIG. 7 is a schematic structural diagram of a page buffer provided by examples of the present disclosure.

Therefore, examples of the present disclosure provide a page buffer 70. As shown in FIG. 7, FIG. 7 is a schematic structural diagram of a page buffer provided by examples of the present disclosure. The page buffer 70 comprises a sensing latch circuit 71, a first charge circuit 72 and a read calibration circuit 73. The first charge circuit 72 is coupled to a sensing node, and the read calibration circuit 73 is coupled to the sensing latch circuit 71 at a first end and to the sensing node at a second end, and is configured to calibrate a potential of the sensing node during sensing.

In an example, the sensing latch circuit 71 may be configured to store a state of a memory cell coupled with a bit line, and the first charge circuit 72 may be configured to charge the sensing node.

Figure 8:
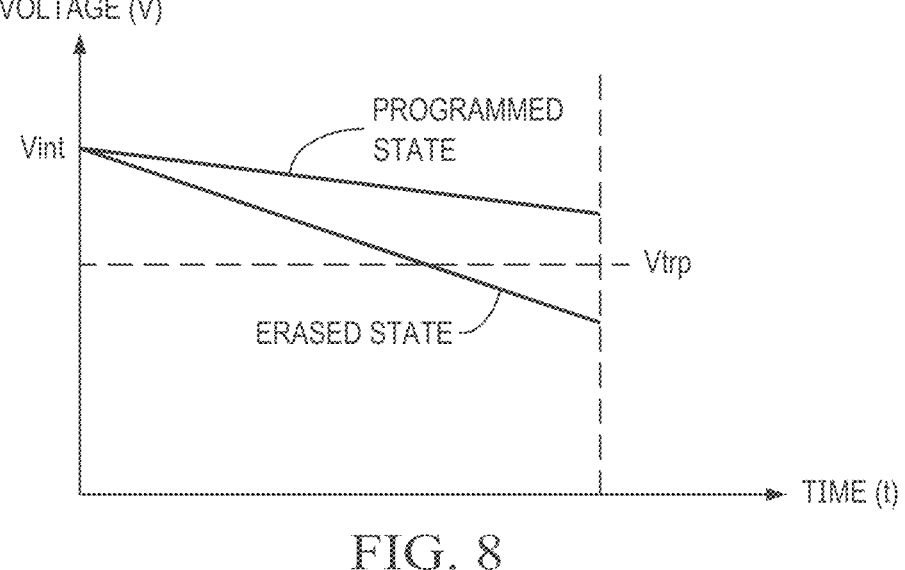
FIG. 8 is a variation diagram of a potential of a sensing node in a sensing stage provided by examples of the present disclosure.

A sensing process may comprise a sensing stage. A variation diagram of the potential of the sensing node in the sensing stage is as shown in FIG. 8. The operations of the sensing stage may comprise: initially, the first charge circuit 72 charges the sensing node, and the potential of the sensing node is charged to an initial voltage (Vint) that may be less than or equal to a system voltage (VDD). After the sensing node is charged, the first charge circuit 72 is turned off, and the sensing node starts to be coupled to the bit line to start discharging. After a period of time, the voltage of the sensing node drops to a stable level. At this time, if the voltage of the sensing node is higher than a trip voltage (Vtrp), the memory cell coupled with the bit line may be determined as a programmed state; and if the voltage of the sensing node is lower than the trip voltage, the memory cell coupled with the bit line may be determined as an erased state. A determined result is stored in the sensing latch circuit 71.

In addition, the sensing process may further comprise a calibration stage that is performed before the sensing stage to calibrate the initial voltage (Vint) of the sensing node to eliminate the voltage offset in the page buffer 70 caused by a device process, such that the reliability of a sensing result of the page buffer 70 can be improved.

A working process and relevant structures of the page buffer 70 in the calibration stage are introduced and illustrated below.

Figure 9:
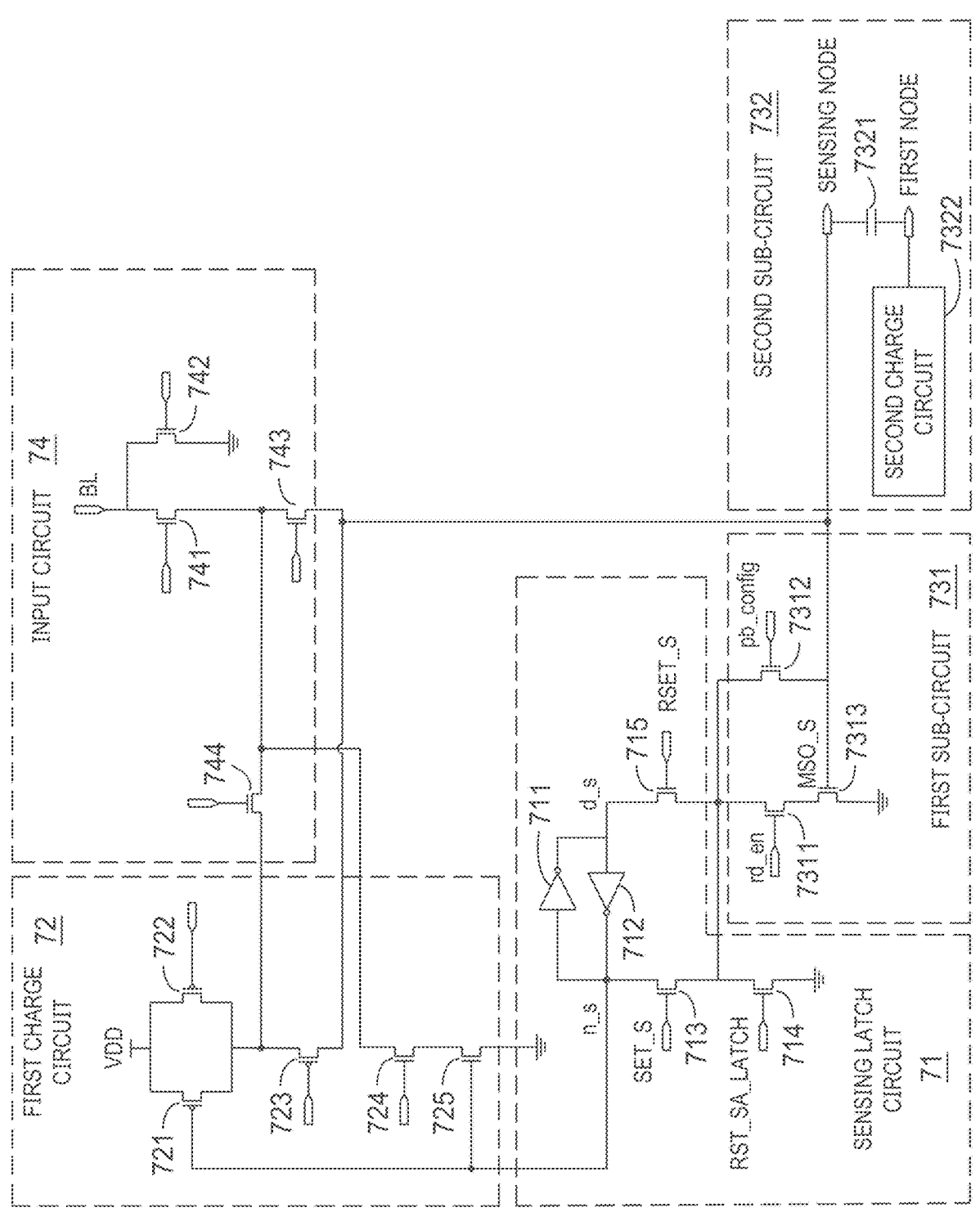
FIG. 9 is a schematic structural diagram of another page buffer provided by examples of the present disclosure.

In an example, as shown in FIG. 9, FIG. 9 is a schematic structural diagram of another page buffer provided by examples of the present disclosure. The read calibration circuit 73 may comprise a first sub-circuit 731 and a second sub-circuit 732, wherein the first sub-circuit 731 is configured to discharge the sensing node from a first voltage value to a second voltage value in a first sub-stage of the calibration stage, and the second sub-circuit 732 is configured to charge the sensing node from the second voltage value to a third voltage value in a second sub-stage of the calibration stage. For example, the first voltage value is greater than the second voltage value, and the third voltage value is greater than the second voltage value.

Figure 10:
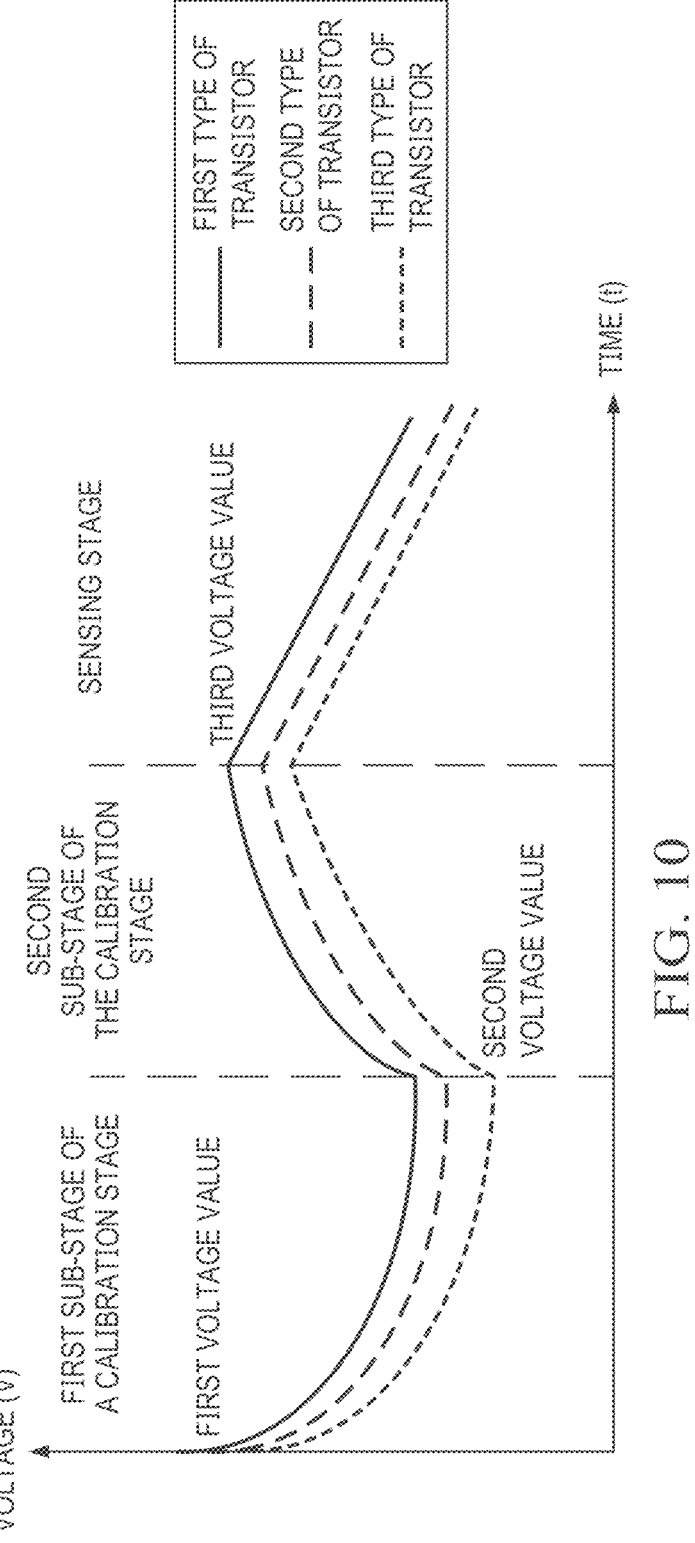
FIG. 10 is a variation diagram of a potential of a sensing node in a sensing process provided by examples of the present disclosure.

A potential variation of the sensing node in the sensing process is as shown in FIG. 10. A horizontal axis of FIG. 10 represents time, and a vertical axis of FIG. 10 represents a voltage of the sensing node. Threshold voltages of the transistors of different processes are different, and the transistors of different processes may include a first type of transistor, a second type of transistor and a third type of transistor. FIG. 10 respectively shows a potential variation of the sensing node of the page buffer comprising the first type of transistor, a potential variation of the sensing node of the page buffer comprising the second type of transistor, and a potential variation of the sensing node of the page buffer comprising the third transistor. Starting from the first sub-stage of the calibration stage, the voltages of the sensing node are all charged to the first voltage value that may be an initial voltage (Vint). During the first sub-stage of the calibration stage, the sensing node is discharged from the first voltage value to the second voltage value. At this time, since the threshold voltages of the transistors of different processes are different, the sensing node of the page buffer comprising the transistors of different processes has three different second voltage values. In the second sub-stage of the calibration stage, the sensing node is charged from the second voltage value to the third voltage value, and the voltage of the sensing node of the page buffer of each process is raised from the second voltage value to the same voltage, that is three different third voltage values are obtained. Subsequently, a discharging process of the sensing stage starts. As such, the sensing nodes of the page buffer comprising the transistors of different processes have different initial voltages at the beginning of the sensing stage, and the voltage offset in the page buffer is calibrated, which can improve the reliability of a sensing result of the page buffer.

In an example, with continued reference to FIG. 9, the first sub-circuit 731 comprises a first transistor 7311, a second transistor 7312 and a third transistor 7313. A first end of the first transistor 7311 is coupled to a first end of the read calibration circuit 73, and a second end of the first transistor 7311 is coupled to a first end of the third transistor. A first end of the second transistor 7312 is coupled to the first end of the first transistor 7311, a second end of the second transistor 7312 and a second end of the third transistor 7313 are coupled and coupled to a second end of the read calibration circuit 73, and a control end of the third transistor 7313 is coupled to ground.

In an example, the first transistor 7311, the second transistor 7312 and the third transistor 7313 may be an N metal oxide semiconductor (NMOS). The first end of the first transistor 7311 is a drain, the second end of the first transistor 7311 is a source, and a control end of the first transistor 7311 is a gate, wherein the control end of the first transistor 7311 is configured to receive a read enable signal (rd_en). The first end of the second transistor 7312 is a drain, the second end of the second transistor 7312 is a source, and a control end of the second transistor 7312 is a gate, wherein the control end of the second transistor 7312 is configured to receive a page buffer configuration signal (pb_config). The first end of the third transistor 7313 is a drain, the second end of the third transistor 7313 is a source, and the control end of the third transistor 7313 is a gate, wherein the control end of the third transistor 7313 is configured to receive a sensing signal (MSO_S).

Taking the first transistor 7311 as an example, if rd_en is at a high level, then the first transistor 7311 is turned on. If rd_en is at a low level, then the first transistor 7311 is cut off. For example, an NMOS transistor is turned on when the gate at a high level, and is cut off when the gate is at a low level.

In the first sub-stage of the calibration stage, the first transistor 7311 and the second transistor 7312 are turned on, and the third transistor 7313 is cut off.

Figure 11:
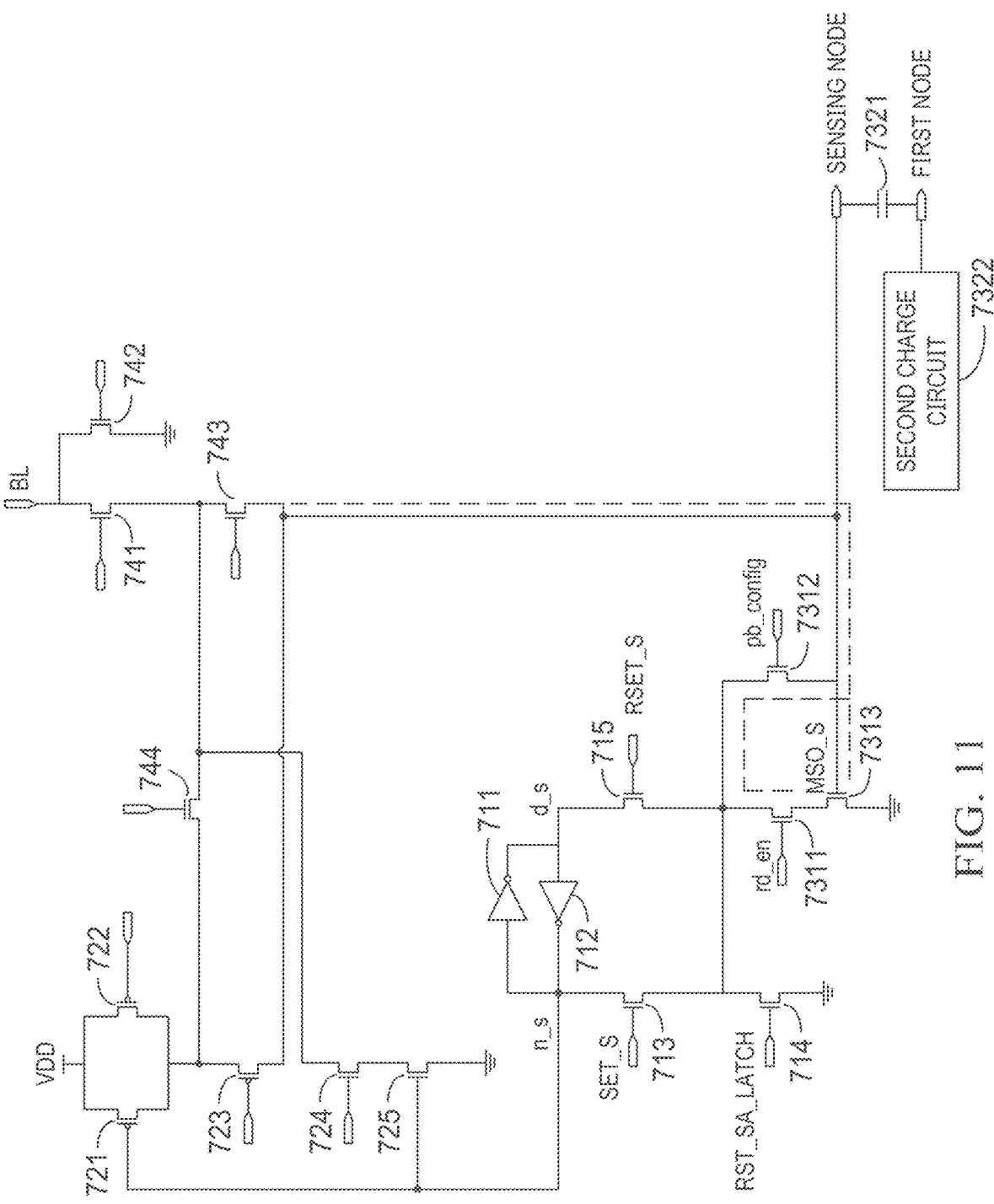
FIG. 11 is an equivalent diagram of a potential of a sensing node in a first sub-stage of a calibration stage provided by examples of the present disclosure.

As shown in FIG. 11, FIG. 11 is a diagram of a potential of a sensing node in a first sub-stage of a calibration stage provided by examples of the present disclosure. If pb_config is at a high level, then the second transistor 7312 is turned on, and a potential of the drain of the second transistor 7312 and a potential of the sensing node are the same. If rd_en is at a high level, then the first transistor 7311 is turned on, and a potential of the drain of the third transistor 7313 and a potential of the sensing node are the same. At this time, the potentials of the drain and the gate of the third transistor 7313 are both the same as the potential of the sensing node. As such, the third transistor 7313 form a diode connection. The sensing node is discharged through the third transistor 7313, and a voltage of the sensing node is discharged from the first voltage value to the second voltage value. Since the threshold voltages of the different third transistors 7313 are different, the second voltage values after discharging through the different third transistors 7313 are different. Information of the threshold voltage of the third transistor 7313 may be recorded through the second voltage value of the sensing node.

In the second sub-stage of the calibration stage, the first transistor 7311 and the third transistor 7313 are cut off, and the second transistor 7312 is turned on.

Figure 12:
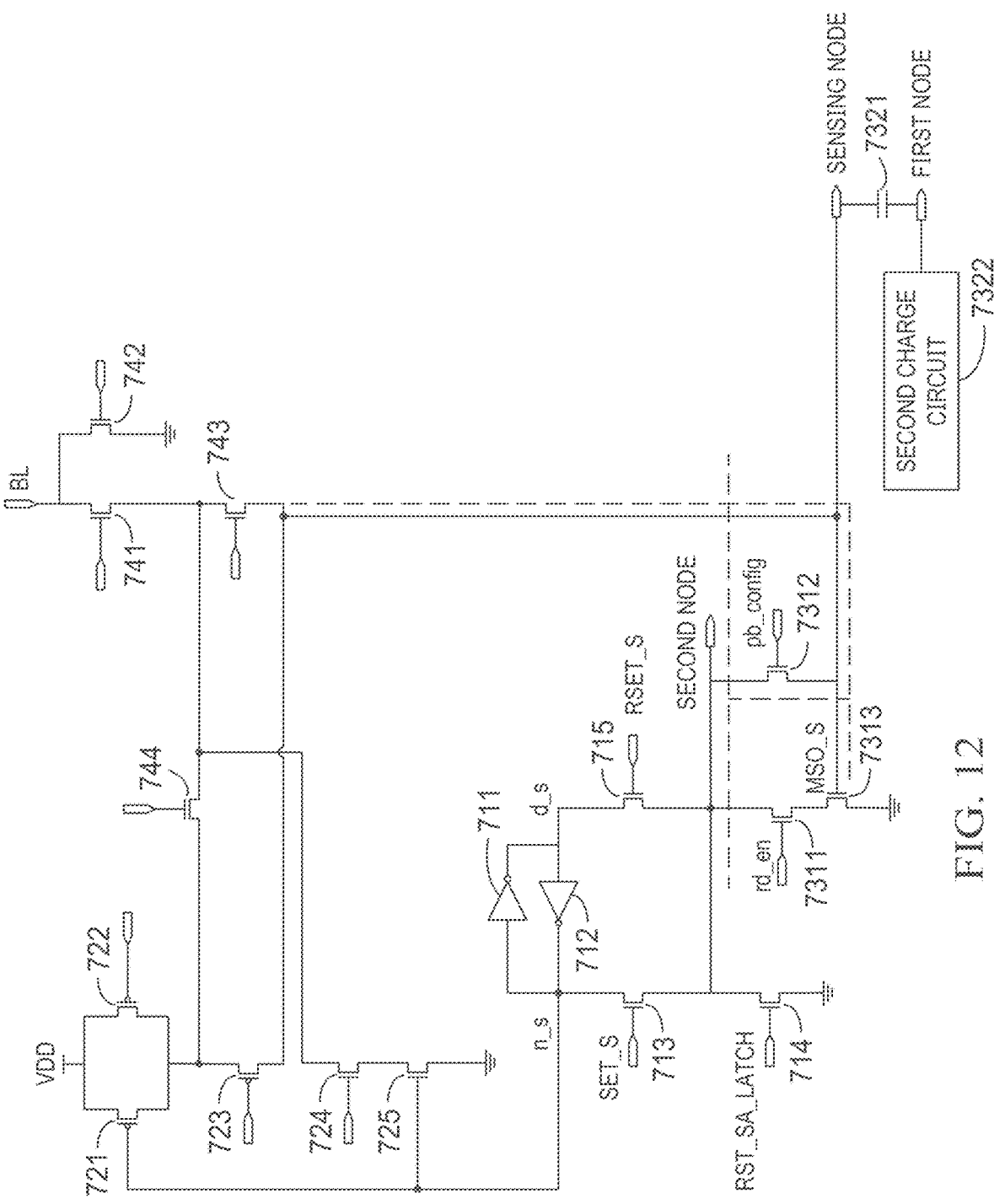
FIG. 12 is an equivalent diagram of a potential of a sensing node in a second sub-stage of a calibration stage provided by examples of the present disclosure.

As shown in FIG. 12, FIG. 12 is a diagram of a potential of a sensing node in a second sub-stage of a calibration stage provided by examples of the present disclosure. If pb_config is at a high level, then the second transistor 7312 is turned on, and a potential of the drain of the second transistor 7312 and a potential of the sensing node are the same. If rd_en is at a low level, then the first transistor 7311 is cut off, and the sensing node stops discharging.

In addition, an output end of the sensing latch circuit 71 may be regarded as a second node. If the second transistor 7312 is turned on, then the sensing node and the second node are turned on, and a capacitance of the sensing node can be increased. As such, the precision of the sensing node in the sensing stage can be improved, and the reliability of the sensing result is improved.

In an example, the second sub-circuit 732 comprises a capacitance 7321 and a second charge circuit 7322. A first end of the capacitance 7321 is coupled to the sensing node, a second end of the capacitance 7321 is coupled to the first node, and the first node is further coupled to an output end of the second charge circuit 7322. The second charge circuit 7322 is configured to charge the first node in the second sub-stage of the calibration stage, and the sensing node is charged from the second voltage value to the third voltage value.

In an example, the capacitance 7321 has the characteristic that a capacitance capacity and a capacitance potential difference do not have an abrupt change. If a voltage value at one end of the capacitance 7321 is changed, at the moment of a voltage variation, a voltage value at the other end of the capacitance 7321 also changes, but a total potential difference between the two ends of the capacitance 7321 does not change. As such, if the second charge circuit 7322 charges the first node, supposing that the voltage value of the first node increases by 3V, that is, the voltage value at the second end of the capacitance 7321 increases by 3V, since the total potential difference is unchanged, the voltage value at the first end of the capacitance 7321 also increases by 3V, that is, the voltage value of the sensing node also increases 3V.

As such, in the second sub-stage of the calibration stage, the first transistor 7311 and the third transistor 7313 are cut off, and the second transistor 7312 is turned on. At this time, the sensing node stops discharging. The second charge circuit 7322 charges the first node. In an example, the first node may be charged to a system voltage (VDD), and the sensing node is coupled and raised from the second voltage value to the third voltage value, wherein a difference between the third voltage value and the second voltage value may be a system voltage value.

In an example, the capacitance 7321 is a stray capacitance.

Figure 13:
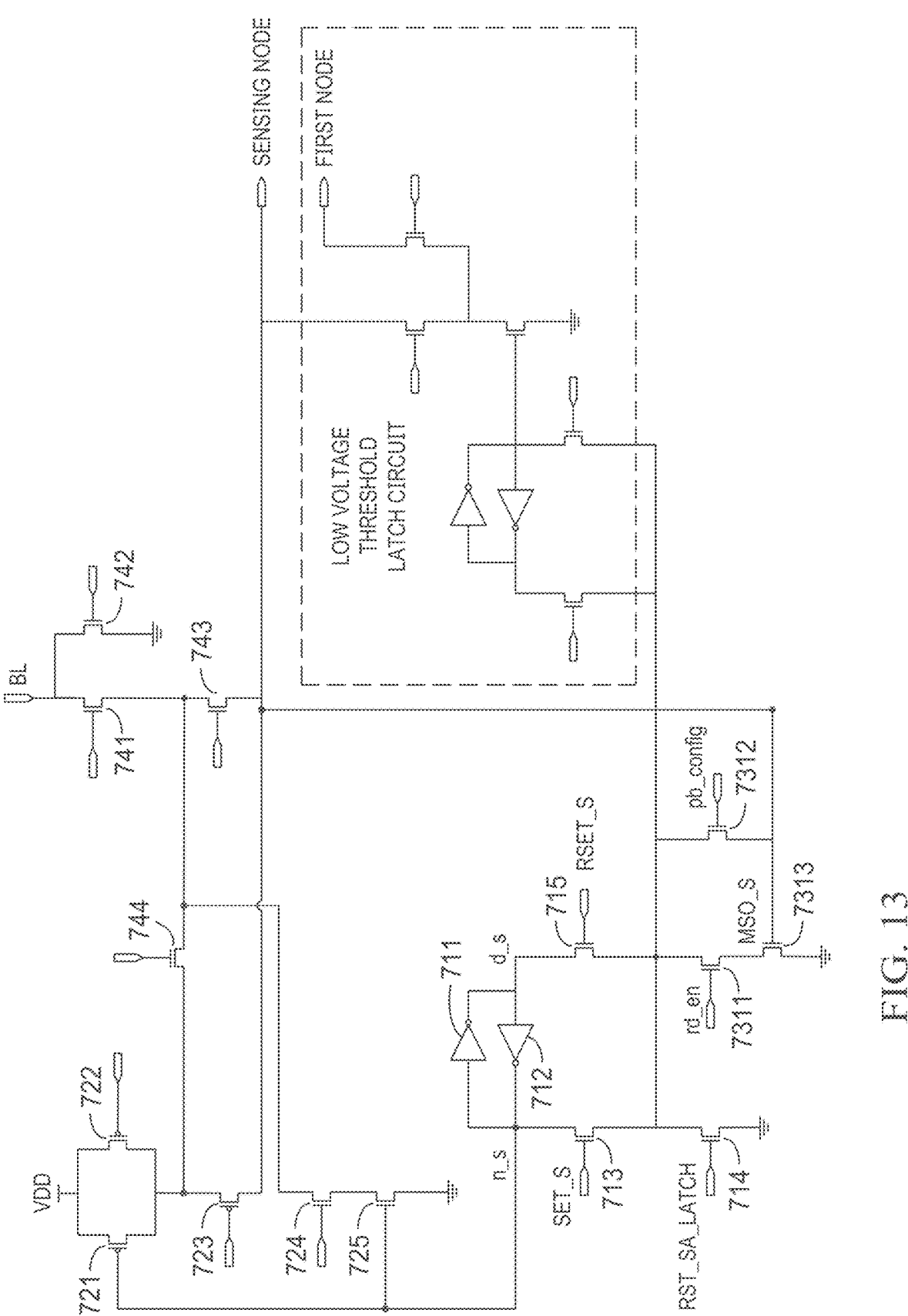
FIG. 13 is a schematic structural diagram of a first node and a sensing node provided by examples of the present disclosure.

In an example, the first node may be a node in the page buffer 70 adjacent to the sensing node, no capacitance is designed between the first node and the sensing node, but a stray capacitance is present between the first node and the sensing node due to routing of a circuit board. In one example, as shown in FIG. 13, the first node may be a node in a low voltage threshold latch (LVT Latch) circuit which may be used to store fail bits. As such, the voltage of the sensing node may be coupled and raised using the stray capacitance present between the first node and the sensing node, so as to provide enough initial voltage value in the subsequent sensing stage.

In another example, a voltage of the gate of the second transistor 7312 may also be increased, such that the stray capacitance between the gate and the source of the second transistor 7312 may be increased, thereby coupling and raising the voltage of the sensing node.

In an example, with continued reference to FIG. 9, the sensing latch circuit 71 comprises a first phase inverter 711, a second phase inverter 712, a fourth transistor 713, a fifth transistor 714 and a sixth transistor 715. A first end of the first phase inverter 711 is coupled to a first end of the second phase inverter 712, and a second end of the first phase inverter 711 is coupled to a second end of the second phase inverter 712. A first end of the fourth transistor 713 is coupled to the first end of the first phase inverter 711, a second end of the fourth transistor 713 is coupled to a first end of the sixth transistor 715, and a second end of the sixth transistor 715 is coupled to ground. A first end of the fifth transistor 714 is coupled to the second end of the second phase inverter 712, and a second end of the fifth transistor 714 is coupled to a first end of the sensing latch circuit 71.

In an example, the fourth transistor 713, the fifth transistor 714 and the sixth transistor 715 may be NMOS transistors. The first end of the fourth transistor 713 is a drain, the second end of the fourth transistor 713 is a source, and a control end of the fourth transistor 713 is a gate, wherein the control end of the fourth transistor 713 is configured to receive a set signal (SET_S). The first end of the fifth transistor 714 is a drain, the second end of the fifth transistor 714 is a source, and a control end of the fifth transistor 714 is a gate, wherein the control end of the fifth transistor 714 is configured to receive a reset signal (RSET_S). The first end of the sixth transistor 715 is a drain, the second end of the sixth transistor 715 is a source, and a control end of the sixth transistor 715 is a gate, wherein the control end of the sixth transistor 715 is configured to receive a sensing signal (MSO_S).

In an example with continued reference to FIG. 9, the page buffer 70 further comprises an input circuit 74, wherein a first end of the input circuit 74 is coupled to a bit line, and a second end of the input circuit 74 is coupled to the sensing node.

The input circuit 74 may comprise a seventh transistor 741, an eighth transistor 742, a ninth transistor 743 and a tenth transistor 744. The seventh transistor 741, the eighth transistor 742, the ninth transistor 743 and the tenth transistor 744 are all NMOS transistors. A drain of the seventh transistor 741 is coupled to a bit line, and a source of the seventh transistor 741 is coupled to a drain of the ninth transistor 743. A drain of the eighth transistor 742 is coupled to the drain of the seventh transistor 741, and a source of the eighth transistor 742 is coupled to ground. A drain of the ninth transistor 743 is coupled to the sensing node, and further coupled to a drain of the tenth transistor 744, and a source of the tenth transistor 744 is coupled to the first charge circuit 72.

In an example, the first charge circuit 72 may comprise an eleventh transistor 721, a twelfth transistor 722, a thirteenth transistor 723, a fourteenth transistor 724 and a fifteenth transistor 725. The eleventh transistor 721, the twelfth transistor 722 and the thirteenth transistor 723 are PMOS transistors, and the fourteenth transistor 724 and the fifteenth transistor 725 are NMOS transistors. A drain of the eleventh transistor 721 is coupled to a system voltage source, a source of the eleventh transistor 721 is coupled to a drain of the thirteenth transistor 723, and a gate of the eleventh transistor 721 is coupled to the first latch node (n_s). A drain of the twelfth transistor 722 is coupled to the system voltage source, and a source of the twelfth transistor 722 is coupled to the drain of the thirteenth transistor 723. The drain of the thirteenth transistor 723 is further coupled to the source of the tenth transistor 744, and a source of the thirteenth transistor 723 is coupled to the sensing node. A drain of the fourteenth transistor 724 is coupled to the drain of the tenth transistor 744, a source of the fourteenth transistor 724 is coupled to a drain of the fifteenth transistor 725, a source of the fifteenth transistor 725 is coupled to ground, and a gate of the fifteenth transistor 725 is coupled to the first latch node (n_s).

In the sensing stage, the first transistor 7311 is turned on, and the second transistor 7312 is cut off.

Figure 14:
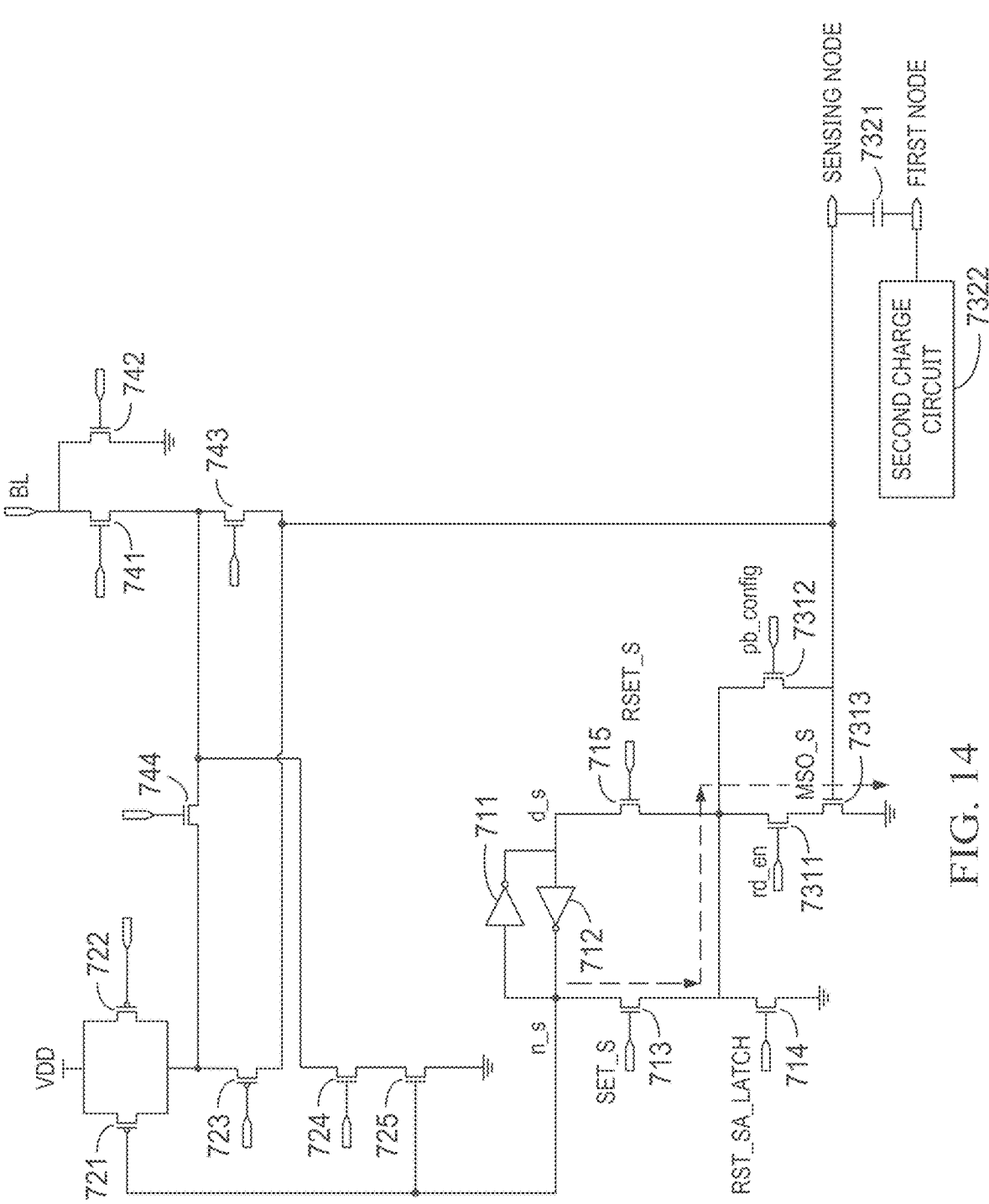
FIG. 14 is an equivalent diagram of a potential of a first latch node in a sensing stage provided by examples of the present disclosure.

As shown in FIG. 14, FIG. 14 is an equivalent diagram of a potential of a first latch node in a sensing stage provided by examples of the present disclosure. In the sensing stage, pb_config is at a low level, and the second transistor 7312 is cut off; and rd_en is at a high level, and the first transistor 7311 is turned on. At this time, SET_S is also at a high level, and the fourth transistor 713 is turned on. In an example, in the sensing stage, supposing that a potential of the first latch node is a high level, if a potential of the sensing node after discharging is still a high level, then the potential of the first latch node is still the high level, and data "1" is stored in the sensing latch circuit 71, wherein "1" means that a state of a sensed memory cell is a programmed state. If the potential of the sensing node after discharging is a low level, then the third transistor 7313 is turned on, the potential of the first latch node is pulled down to a low level, and data "0" is stored in the sensing latch circuit 71, wherein "0" means that a state of a sensed memory cell is an erased state.

In addition, the read calibration circuit 73 may also read a state of a memory cell coupled with a bit line stored in the sensing latch circuit 71. In an example, the first transistor 7311 and the fourth transistor 713 are turned on, and the second transistor 7312 is cut off. In an example in which the sensing node is at a low level, if the first latch node is at a high level, then the third transistor 7313 is turned on. At this time, the potential of the first latch node is pulled down to a low level, for example, a state of the sensing latch circuit 71 is flipped, and a state of the memory cell stored in the sensing latch circuit 71 is a programmed state. If the first latch node is at a low level, then the third transistor 7313 is cut off. At this time, the potential of the first latch node is still at the low level, for example, the state of the sensing latch circuit 71 is not flipped, and the state of the memory cell stored in the sensing latch circuit 71 is an erased state.

In addition, the memory may comprise a plurality of bit lines each coupled to the page buffer. For a control signal of the transistors in page buffer, in order to excessive instantaneous current caused by concurrent operations, successive start-up in a stagger manner is commonly used. For the page buffer provided by the examples of the present disclosure, as shown in FIG. 15, stagger control is only desired for the control signal (rd_en) of the second transistor 7312. For example, a high level of rd_en1 is later than a high level of rd_en0, a high level of rd_en2 is later than a high level of rd_en1, and a high level of rd_en3 is later than a high level of rd_en2. In addition, signals (e.g., SET_S) of the other transistors may be started concurrently, such that the complexity of timing control can be reduced.

An operation method of a memory provided by the examples of the present disclosure, which is applied to the above-mentioned page buffer, is introduced below. As shown in FIG. 16, FIG. 16 is a flow diagram of an operation method of a memory provided by examples of the present disclosure. The method comprises the following process.

Operation S1601, the page buffer discharges a sensing node from a first voltage value to a second voltage value in a first sub-stage of a calibration stage.

Operation S1602, the page buffer charges the sensing node from the second voltage value to a third voltage value in a second sub-stage of the calibration stage.

Operation S1603, the page buffer stores a state of a memory cell coupled with a bit line in a sensing stage.

In an example, the sensing process comprises a calibration stage and a sensing stage, wherein the calibration stage is performed before the sensing stage. In the first sub-stage of the calibration stage, a first transistor and a second transistor are controlled to be turned on, and a third transistor is controlled to be cut off, for example, the sensing node can be discharged through the third transistor. At this time, due to different threshold voltages of different third transistors, the second voltage values after discharging are different as well, which means that different information of the threshold voltages is recorded by the second voltage values. In the second sub-stage of the calibration stage, the first transistor and the third transistor are controlled to be cut off, and the second transistor is controlled to be turned on. Thus, the sensing node can be charged through the second sub-circuit to ensure an enough initial voltage value in a subsequent sensing stage. As such, in the whole calibration stage, different threshold voltages are calibrated, which can eliminate the voltage offset in the page buffer and improve the reliability of the sensing result of the page buffer. Additionally, example implementations of S1601 to S1603 may refer to the above illustration of the read calibration circuit, which is no longer repeated here.

In an example, S1602 may comprise: applying, by the page buffer, a first voltage to a control end of a second transistor of a read calibration circuit in the second sub-stage of the calibration stage.

In an example, by applying the first voltage to the control end of the second transistor of the read calibration circuit, stray capacitance between a gate and a source of the second transistor may be increased, and thus, a voltage of the sensing node may be coupled and raised.

In an example, S1602 may comprise: charging, by the page buffer, a first node in the second sub-stage of the calibration stage.

In an example, a stay capacitance is present between the first node and the sensing node, and the voltage of the sensing node may be coupled and raised by charging the first node.

In an example, the method further comprises: charging, by the page buffer, the sensing node to the first voltage value before the first sub-stage of the calibration stage. In an example, the page buffer may charge the sensing node through a first charge circuit to charge the sensing node to the first voltage value.

In an example, the method further comprises: obtaining, by the page buffer, the state of the memory cell coupled with the bit line in the sensing stage. In an example, the page buffer may obtain the state of the memory cell coupled with the bit line through an input circuit.

Some examples of the present disclosure further provide an electronic apparatus. The electronic apparatus may be any one of a cellphone, a desktop computer, a tablet computer, a notebook computer, a server, a vehicle apparatus, a wearable apparatus (e.g., a smart watch, a smart bracelet, and smart glasses, etc.), a mobile power supply, a gaming machine, and a digital multimedia player, etc.

The electronic apparatus may comprise the memory system as described above, and may further comprise at least one of a Central Processing Unit (CPU) and a cache, etc.

The above descriptions are merely example implementations of the present disclosure, and the protection scope of the present disclosure is not limited to these. Any variation or replacement that may be readily figured out by those skilled in the art within the technical scope disclosed by the present disclosure shall be encompassed within the protection scope of the present disclosure. Therefore, the protection scope of the present disclosure shall be defined by the protection scope of the claims.

What is claimed is:

1. A memory, comprising:
   a page buffer comprising:
      a sensing latch circuit;
      a first charge circuit coupled to a sensing node; and
      a read calibration circuit, a first end of the read calibration circuit being coupled to the sensing latch circuit and a second end of the read calibration circuit being coupled to the sensing node, and the read calibration circuit being configured to calibrate a potential of the sensing node in a sensing process, wherein:
   the sensing process comprises a calibration stage; and
   the read calibration circuit comprises:
      a first sub-circuit configured to discharge the sensing node from a first voltage value to a second voltage value in a first sub-stage of the calibration stage; and
      a second sub-circuit configured to charge the sensing node from the second voltage value to a third voltage value in a second sub-stage of the calibration stage.

2. The memory of claim 1, wherein the first sub-circuit comprises a first transistor, a second transistor and a third transistor;
   a first end of the first transistor is coupled to the first end of the read calibration circuit;
   a second end of the first transistor is coupled to a first end of the third transistor;
   a first end of the second transistor is coupled to the first end of the first transistor;
   a second end of the second transistor and a second end of the third transistor are coupled and coupled to the second end of the read calibration circuit; and
   a control end of the third transistor is coupled to ground.

3. The memory of claim 2, wherein:
   the first transistor and the second transistor are turned on and the third transistor is cut off, in the first sub-stage of the calibration stage; and
   the first transistor and the third transistor are cut off and the second transistor is turned on, in the second sub-stage of the calibration stage.

17
18

4. The memory of claim 2, wherein:
the sensing process further comprises a sensing stage; and
in the sensing stage, the first transistor is turned on and the second transistor is cut off.

5. The memory of claim 1, wherein:
the second sub-circuit comprises a capacitance and a second charge circuit;
a first end of the capacitance is coupled to the sensing node;
a second end of the capacitance is coupled a first node;
the first node is further coupled to an output end of the second charge circuit;
the second charge circuit is configured to charge the first node in the second sub-stage of the calibration stage; and
the sensing node is charged from the second voltage value to the third voltage value.

6. The memory of claim 5, wherein the capacitance is a stray capacitance.

7. The memory of claim 1, wherein the sensing latch circuit comprises: a first phase inverter, a second phase inverter, a fourth transistor, a fifth transistor and a sixth transistor;
a first end of the first phase inverter is coupled to a first end of the second phase inverter;
a second end of the first phase inverter is coupled to a second end of the second phase inverter;
a first end of the fourth transistor is coupled to the first end of the first phase inverter;
a second end of the fourth transistor is coupled to a first end of the sixth transistor;
a second end of the sixth transistor is coupled to ground;
a first end of the fifth transistor is coupled to the second end of the second phase inverter; and
a second end of the fifth transistor is coupled to the first end of the sensing latch circuit.

8. The memory of claim 1, wherein the page buffer further comprises an input circuit, wherein a first end of the input circuit is coupled to a bit line, and a second end of the input circuit is coupled to the sensing node.

9. An operation method of a memory, comprising:
discharging a sensing node from a first voltage value to a second voltage value in a first sub-stage of a calibration stage;
charging the sensing node from the second voltage value to a third voltage value in a second sub-stage of the calibration stage; and
storing a state of a memory cell coupled with a bit line in a sensing stage.

10. The method of claim 9, wherein the charging the sensing node from the second voltage value to the third voltage value in the second sub-stage of the calibration stage comprises:
applying a first voltage to a control end of a second transistor of a read calibration circuit in the second sub-stage of the calibration stage.

11. The method of claim 9, wherein the charging the sensing node from the second voltage value to the third voltage value in the second sub-stage of the calibration stage comprises:
charging a first node in the second sub-stage of the calibration stage.

12. The method of claim 9, further comprising:
charging the sensing node to the first voltage value before the first sub-stage of the calibration stage.

13. The method of claim 9, further comprising:

obtaining the state of the memory cell coupled with the bit line in the sensing stage.

14. A memory system, comprising:
one or more memories comprising:
a page buffer comprising:
a sensing latch circuit;
a first charge circuit coupled to a sensing node; and
a read calibration circuit, a first end of the read calibration circuit being coupled to the sensing latch circuit and a second end of the read calibration circuit being coupled to the sensing node, and the read calibration circuit being configured to calibrate a potential of the sensing node in a sensing process,
wherein:
the sensing process comprises a calibration stage; and
the read calibration circuit comprises:
a first sub-circuit configured to discharge the sensing node from a first voltage value to a second voltage value in a first sub-stage of the calibration stage; and
a second sub-circuit configured to charge the sensing node from the second voltage value to a third voltage value in a second sub-stage of the calibration stage; and
a memory controller coupled to the memories and configured to control the memories.

15. The memory system of claim 14, wherein the first sub-circuit comprises a first transistor, a second transistor and a third transistor;
a first end of the first transistor is coupled to the first end of the read calibration circuit;
a second end of the first transistor is coupled to a first end of the third transistor;
a first end of the second transistor is coupled to the first end of the first transistor;
a second end of the second transistor and a second end of the third transistor are coupled and coupled to the second end of the read calibration circuit; and
a control end of the third transistor is coupled to ground.

16. The memory system of claim 15, wherein:
the first transistor and the second transistor are turned on and the third transistor is cut off, in the first sub-stage of the calibration stage; and
the first transistor and the third transistor are cut off and the second transistor is turned on, in the second sub-stage of the calibration stage.

17. The memory system of claim 15, wherein:
the sensing process further comprises a sensing stage; and
in the sensing stage, the first transistor is turned on and the second transistor is cut off.

18. The memory system of claim 14, wherein:
the second sub-circuit comprises a capacitance and a second charge circuit;
a first end of the capacitance is coupled to the sensing node;
a second end of the capacitance is coupled a first node;
the first node is further coupled to an output end of the second charge circuit;
the second charge circuit is configured to charge the first node in the second sub-stage of the calibration stage; and
the sensing node is charged from the second voltage value to the third voltage value.

* * * * *